United States Patent
Hyun et al.

(10) Patent No.: US 11,822,754 B2
(45) Date of Patent: Nov. 21, 2023

(54) DISPLAY DEVICE

(71) Applicant: Samsung Display Co., Ltd., Yongin-si (KR)

(72) Inventors: Chang Ho Hyun, Seoul (KR); Eun Sup Kim, Suwon-si (KR); Joon Hee Song, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/693,110

(22) Filed: Mar. 11, 2022

(65) Prior Publication Data

US 2022/0291782 A1 Sep. 15, 2022

(30) Foreign Application Priority Data

Mar. 15, 2021 (KR) .................. 10-2021-0033661

(51) Int. Cl.
*G06F 3/044* (2006.01)
*G06F 3/041* (2006.01)

(52) U.S. Cl.
CPC .......... *G06F 3/0446* (2019.05); *G06F 3/0448* (2019.05); *G06F 3/04164* (2019.05); *G06F 3/04166* (2019.05)

(58) Field of Classification Search
CPC ............... G06F 3/0446; G06F 3/04166; G06F 3/04164; G06F 3/0448
USPC ........................................................ 345/174
See application file for complete search history.

(56) References Cited

U.S. PATENT DOCUMENTS

| | | | |
|---|---|---|---|
| 2017/0090622 A1* | 3/2017 | Badaye | G06F 3/0448 |
| 2019/0018523 A1* | 1/2019 | Xu | G06F 3/0443 |
| 2022/0004281 A1 | 1/2022 | Hyun et al. | |

FOREIGN PATENT DOCUMENTS

| | | |
|---|---|---|
| CN | 111538434 A | 8/2020 |
| EP | 3678004 A1 | 7/2020 |
| KR | 10-1862394 B1 | 7/2018 |
| KR | 10-2020-0084496 A | 7/2020 |
| KR | 10-2022-0004895 A | 1/2022 |

* cited by examiner

*Primary Examiner* — Mark Edwards
(74) *Attorney, Agent, or Firm* — Lewis Roca Rothgerber Christie LLP

(57) ABSTRACT

A display device includes: a display unit including a plurality of pixels; and a touch sensing unit on a surface of the display unit, the touch sensing unit including first and second touch sensor areas adjacent to each other along a first direction, wherein the touch sensing unit comprises: a plurality of driving electrodes branched off from a plurality of driving lines, with the plurality of driving electrodes extending in a second direction intersecting the first direction, in each of the first and second touch sensor areas; a plurality of sensing electrodes extending in the first direction; a plurality of odd electrodes extending in the second direction in the first touch sensor area; and a plurality of even electrodes extending in the second direction in the second touch sensor area.

18 Claims, 10 Drawing Sheets

DU: SUB, TFTL, EML, TFEL

DISPLAY DEVICE

CROSS-REFERENCE TO RELATED APPLICATION

The present application claims priority to and the benefit of Korean Patent Application No. 10-2021-0033661 filed on Mar. 15, 2021, the entire disclosure of which is incorporated herein by reference.

BACKGROUND

1. Field

Aspects of some embodiments of the present disclosure relate to a display device.

2. Description of the Related Art

As the information society has developed, the demand for display devices for displaying images has diversified. Display devices may be utilized in various electronic devices such as smart phones, digital cameras, notebook computers, navigation systems, and smart televisions. Examples of display devices include flat panel display devices such as liquid crystal display (LCD) devices, field emission display (FED) devices, or organic light-emitting diode (OLED) display devices. The OLED display device, in particular, includes light-emitting elements, which can allow pixels of a display panel to emit light, and can thus display images without the aid of a backlight unit that provides light to the display panel.

Many display devices support touch input from external objects (e.g., a user's finger or a stylus). Display devices can detect touch input from a user and can calculate the location of the touch input as input coordinates. As display devices include sensor layers, the size of flexible films may increase, and the number of input/output (I/O) pins of touch drivers may increase, resulting in increases in the price of modules.

The above information disclosed in this Background section is only for enhancement of understanding of the background and therefore the information discussed in this Background section does not necessarily constitute prior art.

SUMMARY

Aspects of some embodiments of the present disclosure include a display device capable of reducing the sizes of touch pads and flexible films by reducing the number of driving lines.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device includes: a display unit including a plurality of pixels, a touch sensing unit on a surface of the display unit, the touch sensing unit including first and second touch sensor areas adjacent to each other in a first direction. The touch sensing unit comprises: a plurality of driving electrodes branched off of a plurality of driving lines, and the plurality of driving electrodes are extended in a second direction, intersecting the first direction, in each of the first and second touch sensor areas, a plurality of sensing electrodes extended in the first direction, a plurality of odd electrodes extended in the second direction in the first touch sensor area, and a plurality of even electrodes extended in the second direction in the second touch sensor area.

According to some embodiments, the driving electrodes may comprise: a plurality of first branch electrodes branched off of the plurality of driving lines and the plurality of first branch electrodes may be in the first touch sensor area, and a plurality of second branch electrodes branched off of the driving lines and the plurality of second branch electrodes may be in the second touch sensor area.

According to some embodiments, the odd electrodes may be between the first branch electrodes and the sensing electrodes in the first touch sensor area. The even electrodes may be between the second branch electrodes and the sensing electrodes in the second touch sensor area.

According to some embodiments, each pair of first and second branch electrodes branched off of the same driving line may receive the same touch driving signal.

According to some embodiments, each of the first branch electrodes may comprise: a plurality of branch cell electrodes spaced apart from one another in the second direction, and a plurality of first branch line electrodes connecting the first branch cell electrodes. Each of the second branch electrodes may comprise: a plurality of second branch cell electrodes spaced apart from one another in the second direction, and a plurality of second branch line electrodes connecting the second branch cell electrodes.

According to some embodiments, each of the sensing electrodes may comprise: a plurality of sensing cell electrodes spaced apart from one another in the first direction, and a plurality of sensing line electrodes connecting the sensing cell electrodes.

According to some embodiments, the first branch cell electrodes and the sensing cell electrodes may be symmetrical with respect to the odd electrodes. The second branch cell electrodes and the sensing cell electrodes may be symmetrical with respect to the even electrodes.

According to some embodiments, each of the odd electrodes may comprise: a plurality of odd cell electrodes spaced apart from one another in the second direction, and a plurality of odd line electrodes connecting the odd cell electrodes. Each of the even electrodes may comprises: a plurality of even cell electrodes spaced apart from one another in the second direction, and a plurality of even line electrodes connecting the even cell electrodes.

According to some embodiments, the touch sensing unit may comprise: first touch cells including the first branch cell electrodes, some of the sensing cell electrodes, and the odd cell electrodes, and second touch cells including the second branch cell electrodes, others of the sensing cell electrodes, and the even cell electrodes.

According to some embodiments, the first branch cell electrodes may surround first sides of the odd cell electrodes to be spaced apart from each other. The sensing cell electrodes may surround second sides of the odd cell electrodes to be spaced apart from each other. The second branch cell electrodes may surround first sides of the even cell electrodes to be spaced apart from each other. The sensing cell electrodes may surround second sides of the even cell electrodes to be spaced apart from each other.

According to some embodiments, the driving electrodes, the odd electrodes, the even electrodes, and the sensing cell electrodes may be in the same layer.

According to some embodiments, the sensing line electrodes may be in a different layer from the driving electrodes, the odd electrodes, the even electrodes, and the sensing cell electrodes.

According to some embodiments, the odd electrodes may receive an odd signal during an odd period of a touch frame period. The even electrodes may receive an even signal during an even period of the touch frame period. The driving lines may provide a plurality of touch driving signals to the driving electrodes, the touch driving signals may be sequentially delayed over the odd and even periods.

According to some embodiments, the display device may further comprise a touch driver providing the odd signal, the even signal, and the touch driving signals to the touch sensing unit.

According to some embodiments, during the odd period, the touch driver may detect the touch of the first touch sensor area based on variations in capacitances between the first branch electrodes and the sensing electrodes and variations in capacitances between the odd electrodes and the sensing electrodes. During the even period, the touch driver may detect the touch of the second touch sensor area based on variations in capacitances between the second branch electrodes and the sensing electrodes and variations in capacitances between the even electrodes and the sensing electrodes.

According to some embodiments, during the odd period, the touch driver may detect the touch of the first and second touch sensor areas based on variations in capacitances between the first branch electrodes and the sensing electrodes, variations in capacitances between the odd electrodes and the sensing electrodes, and variations in capacitances between the second branch electrodes and the sensing electrodes.

According to some embodiments, during the even period, the touch driver may detect the touch of the first and second touch sensor areas based on variations in capacitances between the first branch electrodes and the sensing electrodes, variations in capacitances between the second branch electrodes and the sensing electrodes, and variations in capacitances between the even electrodes and the sensing electrodes.

According to some embodiments, the touch driver may provide touch driving signals having different pulse widths to the driving lines.

According to some embodiments, the display device may further comprise: first touch pads connected to the driving lines, second touch pads connected to a first split line connected to the odd electrodes, and a second split line connected to the even electrodes, and third touch pads connected to a plurality of sensing lines, the sensing lines are connected to the sensing electrodes.

According to some embodiments, the first and second split lines may be in a different layer from the driving lines.

According to the aforementioned and other embodiments of the present disclosure, the number of driving lines can be reduced by driving multiple driving electrodes that branch off of the same driving lines and are located in first and second touch sensor areas, in a time-division manner with the use of odd electrodes located in the first touch sensor area and even electrodes located in the second touch sensor area, and as a result, the sizes of touch pads and flexible films can be reduced.

Other features and embodiments may be apparent from the following detailed description, the drawings, and the appended claims (and their equivalents).

BRIEF DESCRIPTION OF THE DRAWINGS

The above and other embodiments and features of embodiments according to the present disclosure will become more apparent by describing in more detail aspects of some embodiments thereof with reference to the attached drawings, in which.

DETAILED DESCRIPTION

Figure 1:
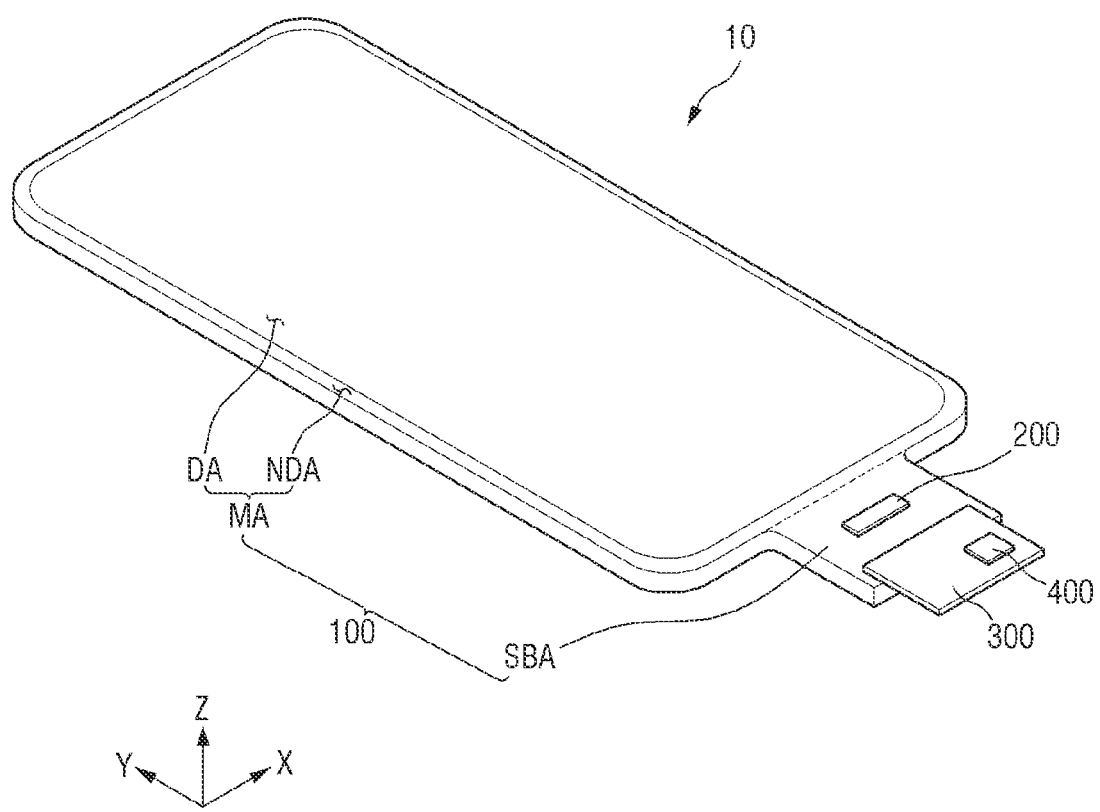
FIG. 1 is a perspective view of a display device according to some embodiments of the present disclosure.

In the following description, for the purposes of explanation, numerous details are set forth in order to provide a more thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to other element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to some embodiments of the present disclosure.

Referring to FIG. 1, a display device 10 may be applicable to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). According to some embodiments, the display device 10 may be used as the display unit of an electronic device, such as a television (TV), a laptop computer, a monitor, a billboard, or an Internet-of-Things (IoT) device. According to some embodiments, the display device 10 may be applicable to a wearable device such as a smartwatch, a watchphone, a glasses display, or a head-mounted display (HMD). According to some embodiments, the display device 10 may be applicable to the dashboard, the center fascia, or the center information display (CID) of a vehicle, the room mirror display of a vehicle that can replace side-view mirrors, or an entertainment display arranged at the rear of the front seat of a vehicle.

The display device 10 may have an almost rectangular shape in a plan view (e.g., a view perpendicular or normal with respect to a plane parallel to a display surface of the display device 10). According to some embodiments, the display device 10 may have an almost rectangular shape with short sides in a first direction (or an X-axis direction) and long sides in a second direction (or a Y-axis direction) in a plan view. The corners at which the short sides and the long sides of the display device 10 meet may be rounded or right-angled. The planar shape of the display device 10 is not limited to a rectangular shape, and the display device 10 may be formed in various other shapes, such as another polygonal shape, a circular shape, or an elliptical shape.

The display device 10 may include a display panel 100, a display driver 200, a circuit board 300, and a touch driver 400.

The display panel 100 may include a main area MA and a subarea SBA.

The main area MA may include a display area DA in which pixels for displaying an image are provided and a non-display area NDA which is arranged around the display area DA. The display area DA may emit light through a plurality of emission areas or a plurality of opening areas. According to some embodiments, the display panel 100 may include pixel circuits including switching elements, a pixel defining film defining emission areas or opening areas, and self-light-emitting elements.

According to some embodiments, the self-light-emitting elements may include organic light-emitting diodes (OLEDs) including organic light-emitting layers, quantum-dot light-emitting diodes (QLEDs) including quantum-dot light-emitting layers, and/or inorganic light-emitting diodes (ILEDs) including inorganic semiconductors, but embodiments according to the present disclosure are not limited thereto.

The non-display area NDA may be an area outside the display area DA. The non-display area NDA may be defined as an edge area of the main area MA of the display area DA. The non-display area NDA may include a gate driver providing gate signals to gate fines and fan-out lines connecting the display driver 200 and the display area DA.

The subarea SBA may extend from one side of the main area MA. The subarea SBA may include a flexible material that is bendable, foldable, or rollable. According to some embodiments, as the subarea SBA is bent, the subarea SBA may overlap with the main area MA in a thickness direction (or a Z-axis direction). The subarea SBA may include the display driver 200 and a pad unit, which is connected to the circuit board 300. Optionally, the subarea SBA may not be provided, and the display driver 200 and the pad unit may be arranged in the non-display area NDA.

The display driver 200 may output signals and voltages for driving the display panel 100. The display driver 200 may provide data voltages to data lines. The display driver 200 may provide power supply voltages to power supply lines and may provide scan control signals to the gate driver. The display driver 200 may be formed as an integrated circuit (IC) and may be mounted on the display panel 100 in a chip-on-glass (COG) or chip-on-plastic (COP) manner or via ultrasonic bonding. According to some embodiments, the display driver 200 may be arranged in the subarea SBA, and as the subarea SBA is bent, the display driver 200 may overlap with the main area MA in the thickness direction (or the Z-axis direction), for example, behind the main area MA. According to some embodiments, the display driver 200 may be mounted on the circuit board 300.

The circuit board 300 may be attached on the pad unit of the display panel 100 via an anisotropic conductive film (ACF). The lead lines of the circuit board 300 may be electrically connected to the pad unit of the display panel 100. The circuit board 300 may be a flexible printed circuit board (FPCB), a printed circuit board (PCB), or a flexible film such as a chip-on-film (COF).

The touch driver 400 may be mounted on the circuit board 300. The touch driver 400 may be connected to the touch sensing unit of the display panel 100. The touch driver 400 may provide touch driving signals to a plurality of touch electrodes and may detect variations in the capacitances of the touch electrodes. According to some embodiments, the touch driving signals may be pulse signals (e.g., having a set or predetermined frequency). The touch driver 400 may detect the presence of touch input and calculate the touch coordinates of the touch input based on the variations in the capacitances of the touch electrodes. The touch driver 400 may be formed as an IC.

Figure 2:
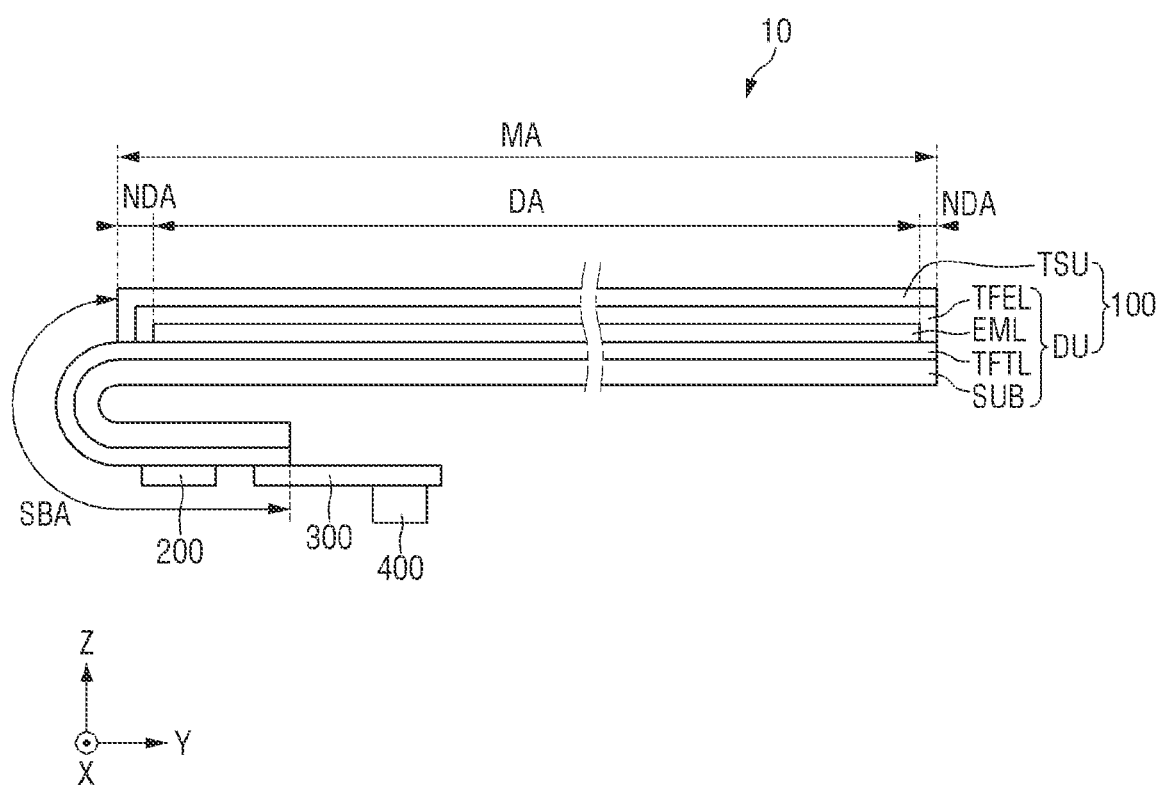
FIG. 2 is a cross-sectional view of the display device of FIG. 1.

FIG. 2 is a cross-sectional view of the display device of FIG. 1.

Referring to FIG. 2, the display panel 100 may include a display unit DU and a touch sensing unit TSU. The display unit DU may include a substrate SUB, a thin-film transistor (TFT) layer TFTL, a light-emitting element layer EML, and an encapsulation layer TFEL.

The substrate SUB may be a base substrate or a base member and may be formed of an insulating material such as a polymer resin. The substrate SUB may be a flexible substrate that is bendable, foldable, or rollable. According to some embodiments, the substrate SUB may include a glass material or a metallic material, but embodiments according to the present disclosure are not limited thereto. According to some embodiments, the substrate SUB may include polyimide (PI).

The TFT layer TFTL may be arranged on the substrate SUB. The TFT layer TFTL may include a plurality of TFTs that form the pixel circuits of pixels. The TFT layer TFTL may gate lines, data lines, power supply lines, gate control lines, and fan-out lines, which connect the display driver 200 and the data lines, and lead lines, which connect the display driver 200 and the pad unit. Each of the TFTs may include a semiconductor region, a source electrode, a drain electrode, and a gate electrode. According to some embodiments, in a case where the gate driver is formed on one side of the non-display area NDA of the display panel 100, the gate driver may include the TFTs.

The TFT layer TFTL may be arranged in the display area DA, the non-display area NDA, and the subarea SBA. The TFTs, the gate lines, the data lines, and the power supply lines of the TFT layer TFTL may be arranged in the display area DA. The gate control lines and the fan-out lines of the TFT layer TFTL may be arranged in the non-display area NDA. The lead lines of the TFT layer TFTL may be arranged in the subarea SBA.

The light-emitting element layer EML may be arranged on the TFT layer TFTL. The light-emitting element layer EML may include a plurality of light-emitting elements, in which first electrodes, emission layers, and second electrodes are sequentially stacked to emit light, and a pixel-defining film, which defines pixels. The light-emitting elements of the light-emitting element layer EML may be arranged in the display area DA.

According to some embodiments, the emission layers may be organic emission layers including an organic material. The light-emitting layers may include hole transport layers, organic light-emitting layers, and electron transport layers. As the first electrodes receive a voltage (e.g., a set or predetermined voltage) via the TFTs of the TFT layer TFTL and the second electrodes receive a cathode electrode, holes and electrons may move to the emission layers through the hole transport layer and the electron transport layers and may be combined together in the emission layers to emit light. According to some embodiments, the first electrodes may be anode electrodes, and the second electrodes may be cathode electrodes. However, embodiments according to the present disclosure are not limited thereto.

According to some embodiments, the light-emitting elements of the light-emitting element layer EML may include QLEDs including quantum-dot light-emitting layers or ILEDs including an inorganic semiconductor.

The encapsulation layer TFEL may cover the top surface and the side surfaces of the light-emitting element layer EML and may protect the light-emitting element layer EML. The encapsulation layer TFEL may include at least one inorganic film and at least one organic film for encapsulating the light-emitting element layer EML.

The touch sensing unit TSU may be arranged on the encapsulation layer TFEL. The touch sensing unit TSU may include a plurality of touch electrodes for detecting touch input from a user (e.g., a touch from a user's finger or a stylus) in a capacitive manner and touch lines for connecting the touch electrodes and the touch driver 400. According to some embodiments, the touch sensing unit TSU may detect touch input from the user in a self-capacitive manner or a mutual capacitance manner.

Alternatively, the touch sensing unit TSU may be arranged on a separate substrate arranged on the display unit DU. In this case, the substrate that supports the touch sensing unit TSU may be a base member that encapsulates the display unit DU.

The touch electrodes of the touch sensing unit TSU may be arranged in a touch sensor area that overlaps with the display area DA. The touch lines of the touch sensing unit TSU may be arranged in a touch peripheral area that overlaps with the non-display area NDA.

The subarea SBA may extend from one side of the main area MA. The subarea SBA may include a flexible material that is bendable, foldable, or rollable. According to some embodiments, as the subarea SBA is bent, the subarea SBA may overlap with the main area MA in the thickness direction (or the Z-axis direction). The subarea SBA may include the display driver 200 and the pad unit, which is connected to the circuit board 300.

Figure 3:
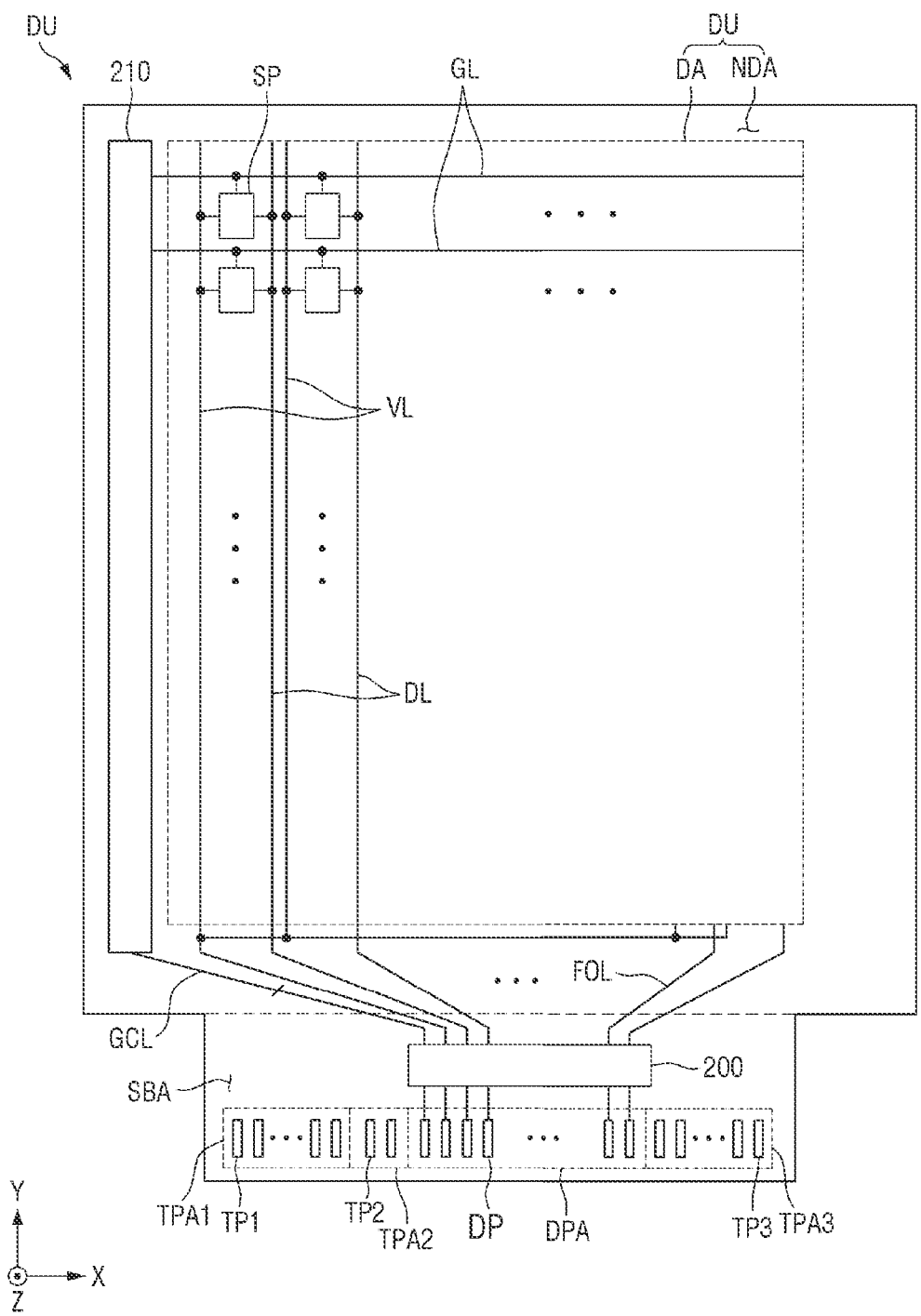
FIG. 3 is a plan view of a display unit of the display device of FIG. 1.

FIG. 3 is a plan view of the display unit of the display device of FIG. 1.

Referring to FIG. 3, the display unit DU may include a display area DA and a non-display area NDA.

The display area DA, which is an area that displays images, may be defined as a central part of the display panel 100. The display area DA may include a plurality of pixels SP, a plurality of gate lines GL, a plurality of data lines DL, and a plurality of power supply lines VL. The pixels SP may be defined as minimal units for outputting light.

The gate lines GL may provide gate signals from a gate driver 210 to the pixels SP. The gate lines GL may extend in the first direction (or the X-axis direction) and may be spaced apart from one another in the second direction (or the Y-axis direction), which intersects the first direction (or the X-axis direction).

The data lines DL may provide data voltages from the display driver 200 to the pixels SP. The data lines DL may extend in the second direction (or the Y-axis direction) and may be spaced apart from one another in the first direction (or the X-axis direction).

The power supply lines VL may provide power supply voltages from the display driver 200 to the pixels SP. Here, the power supply voltages may include at least one of a driving voltage, an initialization voltage, or a reference voltage. The power supply lines VL may extend in the second direction (or the Y-axis direction) and may be spaced apart from one another in the first direction (or the X-axis direction).

The non-display area NDA may surround the display area DA. The non-display area NDA may include the gate driver 210, fan-out lines FOL, and gate control lines GCL. The gate driver 210 may generate a plurality of gate signals based on gate control signals and may sequentially provide the gate signals to the gate lines GL in an order (e.g., a set or predefined or predetermined order).

The fan-out lines FOL may extend from the display driver 200 to the display area DA. The fan-out lines FOL may be connected between the display driver 200 and the data lines DL. The fan-out lines FOL may provide data voltages from the display driver 200 to the data lines DL.

The gate control lines GCL may be connected between the display driver 200 and the gate driver 210. The gate control lines GCL may provide the gate control signals from the display driver 200 to the gate driver 210.

The subarea SBA may include the display driver 200, a display pad area DPA, and first, second, and third touch pad areas TPA1, TPA2, and TPA3.

The display driver 200 may output signals and voltages for driving the display panel 100 to the fan-out lines FOL. The display driver 200 may provide data voltages to the data lines DL through the fan-out lines FOL. The data voltages may be provided to the pixels SP and may determine the luminance of the pixels SP. The display driver 200 may provide the gate control signals to the gate driver 210 through the gate control lines GCL.

The display pad area DPA and the first, second, and third touch pad areas TPA1, TPA2, and TPA3 may be arranged along an edge of the subarea SBA. The display pad area DPA and the first, second, and third touch pad areas TPA1, TPA2, and TPA3 may be electrically connected to the circuit board 300 via a low-resistance, high-reliability member such as an anisotropic conductive film or a self-assembly anisotropic conductive paste (SAP).

The display pad area DPA may include a plurality of display pads DP. The display pads DP may be connected to a main processor through the circuit board 300. The display pads DP may be connected to the circuit board 300 to receive digital video data and to provide digital video data to the display driver 200.

Figure 4:
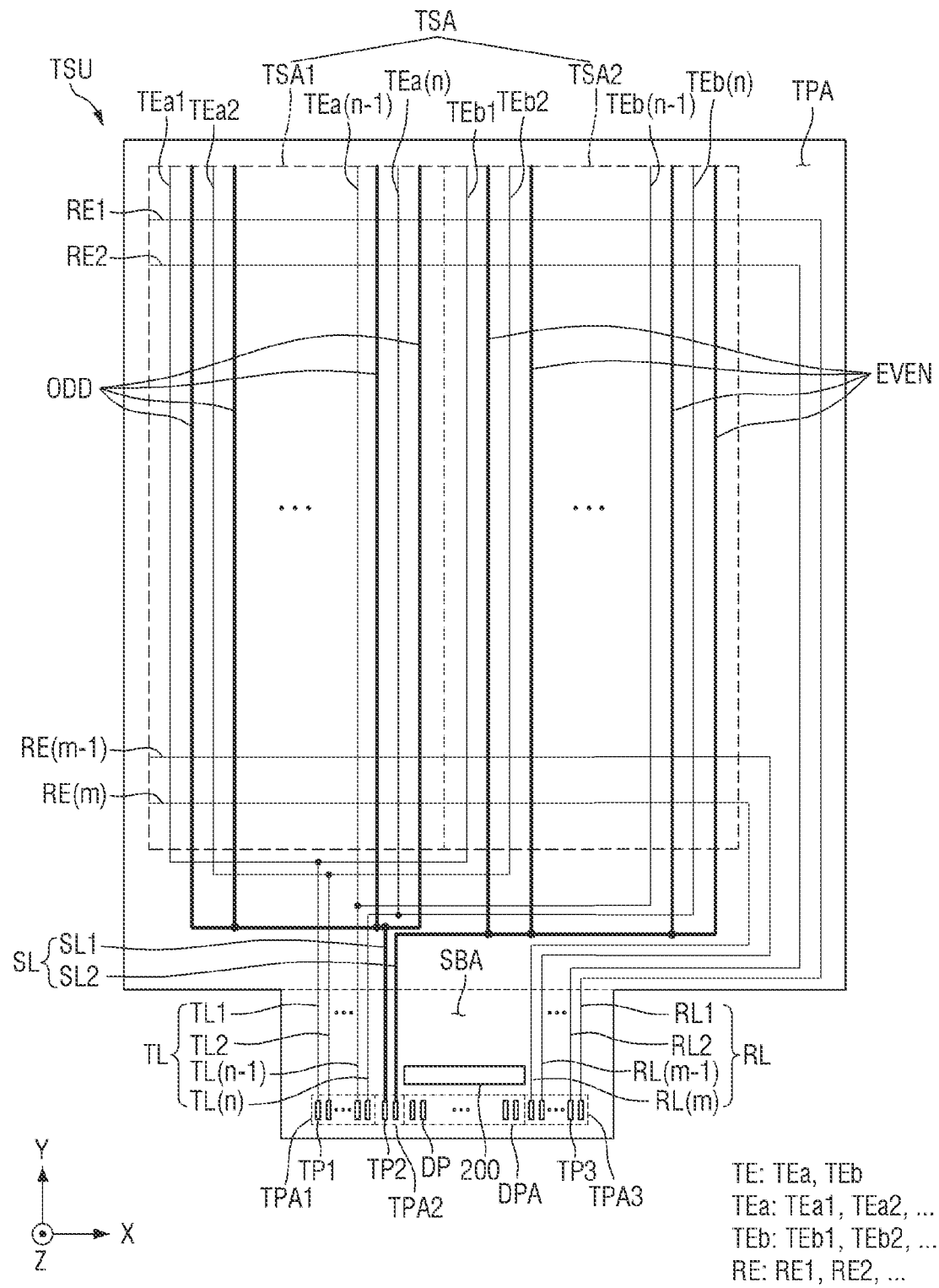
FIG. 4 is a plan view of a touch sensing unit of the display device of FIG. 1.

FIG. 4 is a plan view of the touch sensing unit of the display device of FIG. 1.

Referring to FIG. 4, the touch sensing unit TSU may include a touch sensor area TSA, which detects touch input (e.g., touch input from a user's finger or a stylus) from the user, and a touch peripheral area TPA, which is arranged around (e.g., in a periphery, or outside a footprint of) the touch sensor area TSA. The touch sensor area TSA may overlap with the display area DA of the display unit DU, and the touch peripheral area TPA may overlap with the non-display area NDA of the display unit DU. The touch sensor area TSA may include first and second touch sensor areas TSA1 and TSA2, which are adjacent to each other in the first direction (or the X-axis direction).

The touch sensor area TSA may include a plurality of touch electrodes. The touch electrodes may include a plurality of driving electrodes TE, a plurality of sensing electrodes RE, a plurality of odd electrodes ODD, and a plurality of even electrodes EVEN.

The driving electrodes TE may include first branch electrodes TEa and second branch electrodes TEb. The first branch electrodes TEa may include (1-1)-th through (1-n)-th branch electrodes TEa1 through TEa(n) (where n is an integer of 2 or greater), and the second branch electrodes TEb may include (2-1)-th through (2-n)-th branch electrodes TEb1 through TEb(n). The first branch electrodes TEa and the second branch electrodes TEb may branch off of the driving lines TL. According to some embodiments, the (1-1)-th and (2-1)-th branch electrodes TEa1 and TEb1 may branch off of a first driving line TL1, the (1-1)-th branch electrode TEa1 may extend into the first touch sensor area TSA1, and the (2-1)-th branch electrode TEb1 may extend into the second touch sensor area TSA2. The (1-n)-th branch electrode TEa(n) and the (2-n)-th branch electrode TEb(n) may branch off of an n-th driving line TL(n), the (1-n)-th branch electrode TEa(n) may extend into the first touch sensor area TSA1, and the (2-n)-th branch electrode TEb(n) may extend into the second touch sensor area TSA2. Thus, the (1-1)-th branch electrode TEa1 and the (2-1)-th branch electrode TEb1 may receive the same touch driving signal, and the (1-n)-th branch electrode TEa(n) and the (2-n)-th branch electrode TEb(n) may receive the same touch driving signal.

The first branch electrodes TEa may extend in the second direction (or the Y-axis direction) in the first touch sensor area TSA1 and may be spaced apart from one another in the first direction (or the X-axis direction). The second branch electrodes TEb may extend in the second direction (or the Y-axis direction) from the second touch sensor area TSA2 and may be spaced apart from one another in the first direction (or the X-axis direction). The first branch electrodes TEa and the second branch electrodes TEb may be connected to first touch pads TP1 via driving lines TL. The driving lines TL may extend to the first touch pads TP1 through a lower part of the touch peripheral area TPA. The first touch pads TP1 may be connected to the touch driver 400 through the circuit board 300.

The odd electrodes ODD may extend in the second direction (or the Y-axis direction) in the first touch sensor area TSA1 and may be spaced apart from one another in the first direction (or the X-axis direction). According to some embodiments, the odd electrodes ODD may be arranged adjacent to the (1-1)-th through (1-n)-th branch electrodes TEa1 through TEa(n). The odd electrodes ODD may branch off of a first split line SL1 and may extend into the first touch sensor area TSA1. Thus, the odd electrodes ODD may receive the same odd signal from the first split line SL1. The first split line SL1 may extend to second touch pads TP2 through the lower part of the touch peripheral area TPA. The second touch pads TP2 may be connected to the touch driver 400 through the circuit board 300.

The even electrodes EVEN may extend in the second direction (or the Y-axis direction) in the second touch sensor area TSA2 and may be spaced apart from one another in the first direction (or the X-axis direction). According to some embodiments, the even electrodes EVEN may be arranged adjacent to the (2-1)-th through (2-n)-th branch electrodes TEb1 through TEb(n). The even electrodes EVEN may branch off of a second split line SL2 and may extend into the second touch sensor area TSA2. Thus, the even electrodes EVEN may receive the same odd signal from the second split line SL2. The second split line SL2 may extend to the second touch pads TP2 through the lower part of the touch peripheral area TPA. The second touch pads TP2 may be connected to the touch driver 400 through the circuit board 300.

The sensing electrodes RE may extend in the first direction (or the X-axis direction) and may be spaced apart from one another in the second direction (or the Y-axis direction). The sensing electrodes RE may include first through m-th sensing electrode RE1 through RE(m) (where m is an integer of 2 or greater). According to some embodiments, the first sensing electrode RE1 may be connected to third touch pads TP3 through a first sensing line RL1, and the m-th sensing electrode RE(m) may be connected to the third touch pads TP3 through an m-th sensing line RL(m). A plurality of sensing lines RL may extend to the third touch pads TP3 through a right part and the lower part of the touch sensing area TPA. The third touch pads TP3 may be connected to the touch driver 400 through the circuit board 300.

The first touch sensor area TSA1 may include the first branch electrodes TEa, the odd electrodes ODD, and the sensing electrodes RE. The first branch electrodes TEa, the odd electrodes ODD, and the sensing electrodes RE may form mutual capacitances to detect touch input from the first touch sensor area TSA1.

The second touch sensor area TSA2 may include the second branch electrodes TEb, the even electrodes EVEN, and the sensing electrodes RE. The second branch electrodes TEb, the even electrodes EVEN, and the sensing electrodes RE may form mutual capacitances to detect touch input from the second touch sensor area TSA2.

The display pad area DPA and the first, second, and third touch pad areas TPA1, TPA2, and TPA3 may be arranged along one edge of the subarea SBA. The display pad area DPA and the first, second, and third touch pad areas TPA1, TPA2, and TPA3 may be electrically connected to the circuit board 300 via a low-resistance, high-reliability member such as an anisotropic conductive film or an SAP.

The first touch pad area TPA1 may be arranged on one side of the second touch pad area TPA2 and may include a plurality of first touch pads TP1. The first touch pads TP1 may be electrically connected to the touch driver 400, which are arranged on the circuit board 300. The first touch pads TP1 may provide touch driving signals to the driving electrodes TE through the driving lines TL.

The second touch pad area TPA2 may be arranged on one side of the display pad area DPA. The second touch pad area TPA2 may be arranged between the first touch pad area TPA1 and the display pad area DPA and may include a plurality of second touch pads TP2. The second touch pads TP2 may be electrically connected to the touch driver 400, which is arranged on the circuit board 300. The second touch pads TP2 may provide an odd signal to the odd electrodes ODD through the first split line SL1 and may provide an even signal to the even electrodes EVEN through the second split line SL2. The first and second split lines SL1 and SL2 may be arranged in a different layer from the driving lines TL.

The third touch pad area TPA3 may be arranged on the other side of the display pad area DPA and may include a plurality of third touch pads TP3. The third touch pads TP3 may be electrically connected to the touch driver 400, which is arranged on the circuit board 300. The touch driver 400 may receive touch sensing signals through the sensing lines RL, which are connected to the third touch pads TP3. The touch driver 400 may sense variations in the capacitances between the first branch electrodes TEa and the sensing electrodes RE, between the odd electrodes ODD and the sensing electrodes RE, between the second branch electrodes TEb and the sensing electrodes RE, and between the even electrodes EVEN and the sensing electrodes RE.

Figure 5:
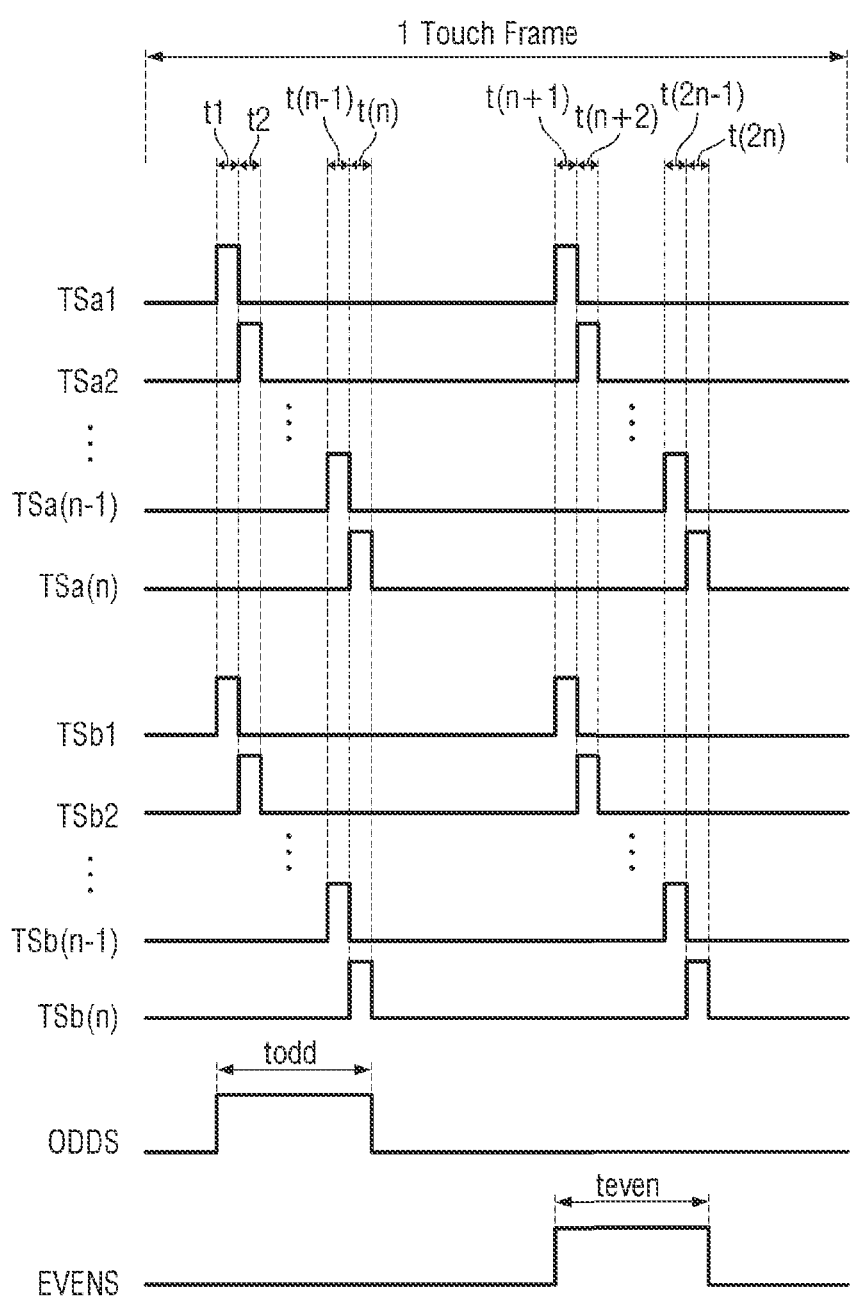
FIG. 5 is a timing diagram showing touch driving signals, an odd signal, and an even signal for the display device of FIG. 1.

FIG. 5 is a timing diagram showing touch driving signals, an odd signal, and an even signal for the display device of FIG. 1.

Referring to FIG. 5, the touch driver 400 may detect the presence of touch input and calculate the coordinates of touch input by providing touch driving signals to the touch sensing unit TSU and receiving touch sensing signals from the touch sensing unit TSU, over one touch frame period.

The touch driver 400 may provide first touch driving signals TSa and second touch driving signals TSb to the driving lines TL through the first touch pads TP1. Here, the first touch driving signals TSa may be provided to the first branch electrodes TEa, and the second touch driving signals TSb may be provided to the second branch electrodes TEb. Thus, the first touch driving signals TSa and the second touch driving signals TSb may be provided by the same touch driver 400, but may have different destinations.

The first touch driving signals TSa may include (1-1)-th through (1-n)-th touch driving signals TSa1 through TSa(n). The (1-1)-th through (1-n)-th touch driving signals TSa1 through TSa(n) may be sequentially delayed over first through n-th periods t1 through t(n) and over (n+1)-th through 2n-th periods t(n+1) through t(2n). According to some embodiments, the first through n-th periods t1 through t(n) may have the same length, and the (n+1)-th through 2n-th periods t(n+1) through t(2n) may have the same length. However, the embodiments according to the present disclosure are not limited thereto. Thus, the (1-1)-th through (1-n)-th touch driving signals TSa1 through TSa(n) may have the same pulse width.

The second touch driving signals TSb may include (2-1)-th through (2-n)-th touch driving signals TSb1 through TSb(n). The (2-1)-th through (2-n)-th touch driving signals TSb1 through TSb(n) may be sequentially delayed over the first through n-th periods t1 through t(n) and over the (n+1)-th through 2n-th periods t(n+1) through t(2n).

The first driving line TL1 may receive the (1-1)-th and (2-1)-th touch driving signals TSa1 and TSb1 from the touch driver 400, the (1-1)-th touch driving signal TSa1 may be provided to the (1-1)-th branch electrode TEa1 over the first period t1, and the (2-1)-th touch driving signal TSb1 may be provided to the (2-1)-th branch electrode TEb1 over the first period t1. The n-th driving line TL(n) may receive the (1-n)-th and (2-n)-th touch driving signals TSa(n) and TSb(n) from the touch driver 400, the (1-n)-th touch driving signal TSa(n) may be provided to the (1-n)-th branch electrode TEa(n) over the n-th period t(n), and the (2-n)-th touch driving signal TSb(n) may be provided to the (2-n)-th branch electrode TEb(n) over the n-th period t(n).

The touch driver 400 may provide an odd signal ODDS to the first split line SL1 through the second touch pads TP2 and may provide an even signal EVENS to the second split signal SL2 through the second touch pads TP2.

The first split line SL1 may provide the odd signal ODDS to the odd electrodes ODD over an odd period todd. The odd electrodes ODD may receive the same odd signal ODDS over the odd period todd. According to some embodiments, the odd period todd may include the first through n-th periods t1 through t(n). Thus, the (1-1)-th through (1-n)-th touch driving signals TSa1 through TSa(n) may be sequentially delayed over the odd period todd. The (2-1)-th through (2-n)-th touch driving signals TSb1 through TSb(n) may be sequentially delayed over the odd period todd.

The second split line SL2 may provide the even signal EVENS to the even electrodes EVEN over an eve period teven. The even electrodes EVEN may receive the same even signal EVENS over the even period teven. According to some embodiments, the even period teven may include the (n+1)-th through 2n-th periods t(n+1) through t(2n). Thus, the (1-1)-th through (1-n)-th touch driving signals TSa1 through TSa(n) may be sequentially delayed over the even period teven. The (2-1)-th through (2-n)-th touch driving signals TSb1 through TSb(n) may be sequentially delayed over the even period teven.

The touch driver 400 may sense variations in the capacitances between the first branch electrodes TEa and the sensing electrodes RE and between the odd electrodes ODD and the sensing electrodes RE by providing the (1-1)-th through (1-n)-th touch driving signals TSa1 through TSa(n) to the first branch electrodes TEa over the first through n-th periods t1 through t(n) and providing the odd signal ODDS to the odd electrodes ODD over the odd period told. The touch driver 400 may sense variations in the capacitances between the a second branch electrodes TEb and the sensing electrodes RE and between the even electrodes EVEN and the sensing electrodes RE by providing the (2-1)-th through (2-n)-th touch driving signals TSb1 through TSb(n) to the second branch electrodes TEb over the (n+1)-th through 2n-th periods t(n+1) through t(2n) and providing the even signal EVENS to the even electrodes EVEN over the even period teven. Thus, the touch driver 400 can sense variations in the capacitances between the driving electrodes TE, which are arranged in 2n columns, and the sensing electrodes RE using n driving lines TL and two split lines SL. Accordingly, the touch driver 400 can reduce the number of driving lines TL and the sizes of the first touch pads TP1 and the circuit board 300 by driving the touch sensing unit TSU in a time-division manner using combinations of the odd signal ODDS, the even signal EVENS, the first touch driving signals TSa, and the second touch driving signals TSb.

Figure 6:
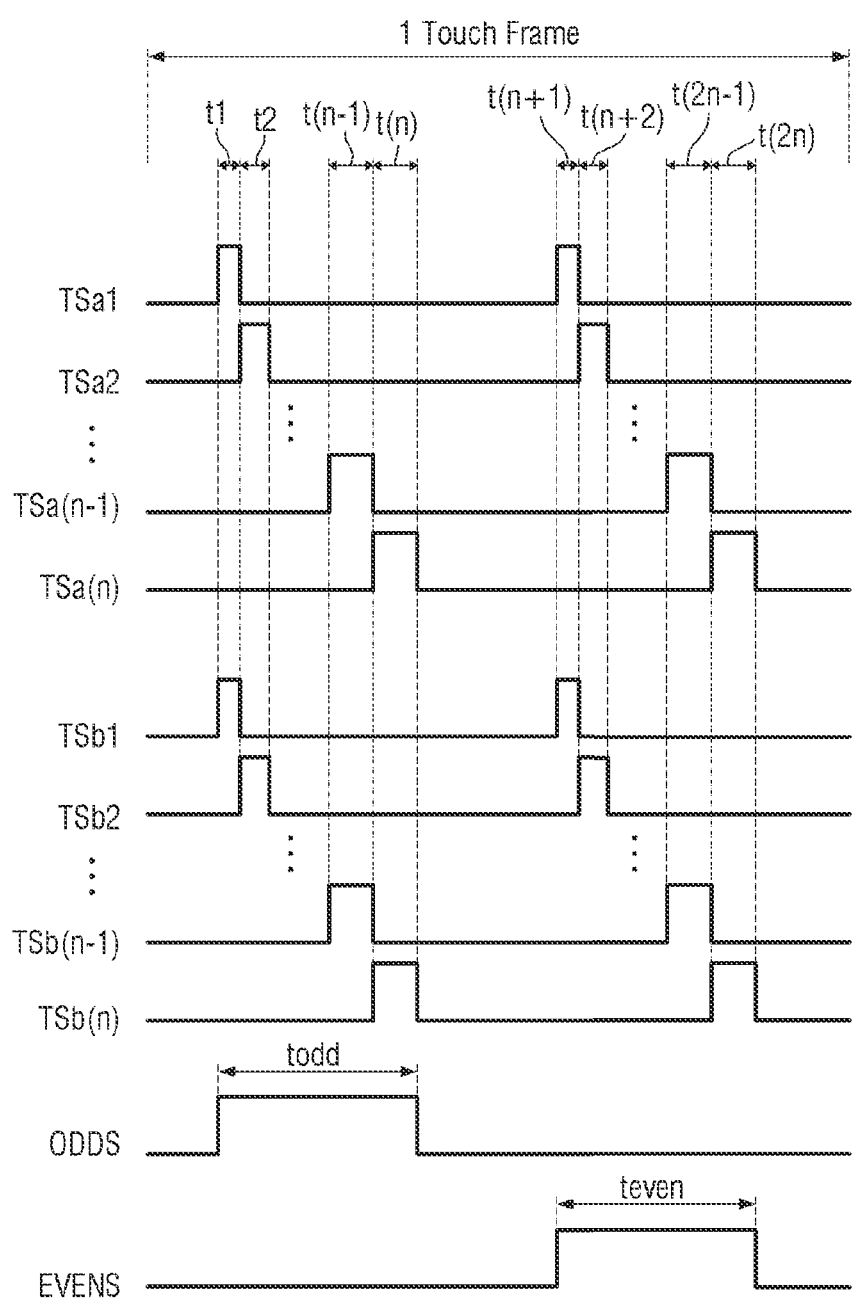
FIG. 6 is a timing diagram showing touch driving signals, an odd signal, and an even signal for a display device according to some embodiments of the present disclosure.

FIG. 6 is a timing diagram showing touch driving signals, an odd signal, and an even signal for a display device according to some embodiments of the present disclosure. The touch driving signals of FIG. 6 are obtained by changing the pulse width of the touch driving signals of FIG. 5, and thus, descriptions of features that have already been described above with reference to FIG. 5 will be omitted or simplified.

Referring to FIG. 6, a touch driver 400 may detect the presence of touch input and calculate the touch coordinates of touch input by providing touch driving signals to a touch sensing unit TSU and receiving touch sensing signals from the touch sensing unit TSU, over one touch frame period.

The touch driver 400 may provide first touch driving signals TSa and second touch driving signals TSb to driving lines TL through first touch pads TP1. Here, the first touch driving signals TSa may be provided to first branch electrodes TEa, and the second touch driving signals TSb may be provided to second branch electrodes TEb. Thus, the first touch driving signals TSa and the second touch driving signals TSb may be provided by the same touch driver 400, but may have different destinations.

The first touch driving signals TSa may include (1-1)-th through (1-n)-th touch driving signals TSa1 through TSa(n). The (1-1)-th through (1-n)-th touch driving signals TSa1 through TSa(n) may be sequentially delayed over first through n-th periods t1 through t(n) and over (n+1)-th through 2n-th periods t(n+1) through t(2n). According to some embodiments, the length of the first through n-th periods t1 through t(n) may increase sequentially, and the length of the (n+1)-th through 2n-th periods t(n+1) through t(2n) may increase sequentially. However, embodiments according to the present disclosure are not limited to this example. Thus, the pulse width of the (1-2)-th touch driving be greater than the pulse width of the (1-1)-th touch driving signal TSa1, and the pulse width of the (1-n)-th touch driving signal TSa(n) may be greater than the pulse width of the (1-(n−1))-th touch driving signal TSa(n−1).

The second touch driving signals TSb may include (2-1)-th through (2-n)-th touch driving signals TSb1 through TSb(n). The (2-1)-th through (2-n)-th touch driving signals TSb1 through TSb(n) may be sequentially delayed over the first through n-th periods t1 through t(n) and over the (n+1)-th through 2n-th periods t(n+1) through t(2n).

Figure 7:
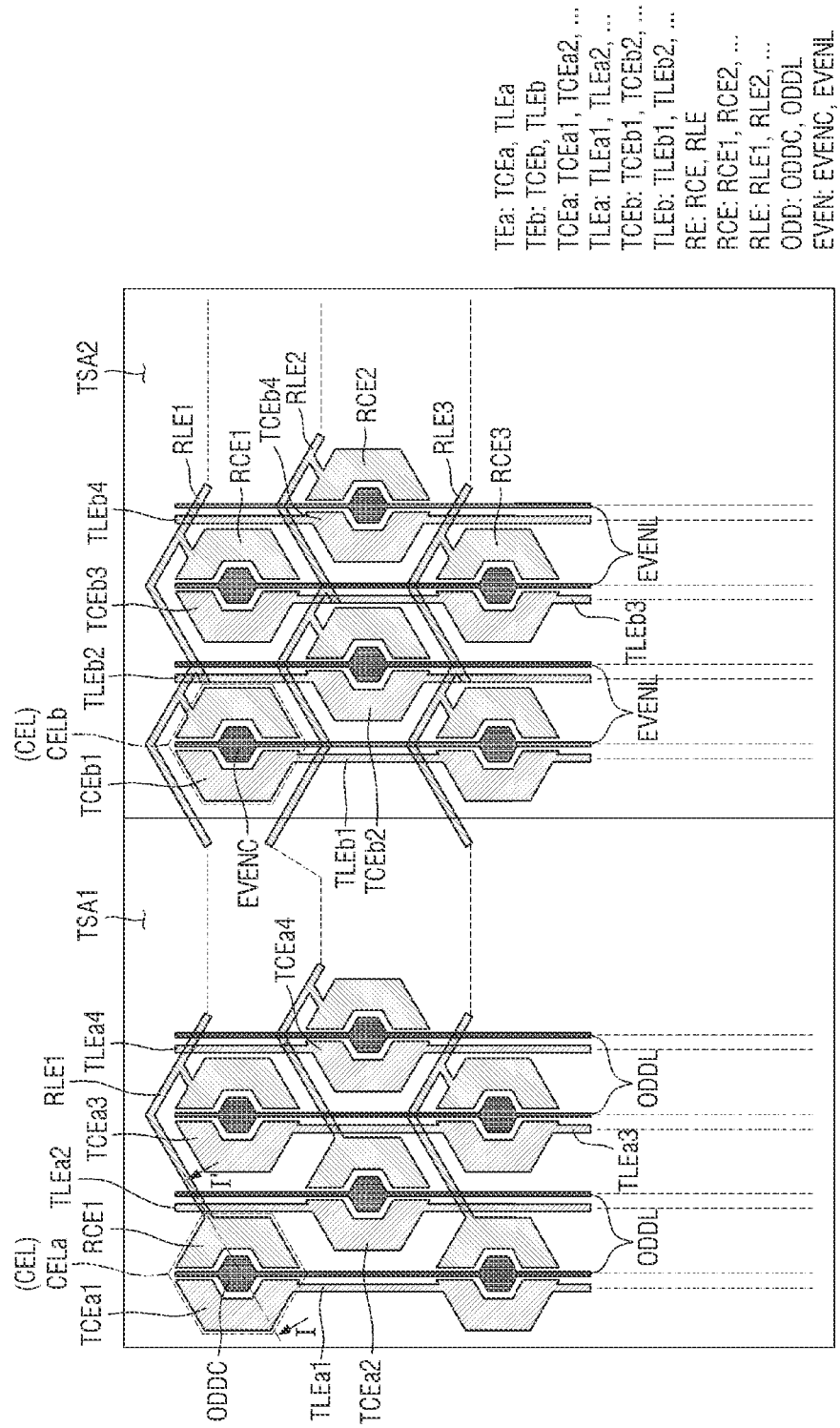
FIG. 7 is a plan view illustrating driving electrodes, sensing electrodes, odd electrodes, and even electrodes of the display device of FIG. 1.

FIG. 7 is a plan view illustrating the driving electrodes, the sensing electrodes, the odd electrodes, and the even electrodes of the display device of FIG. 1.

Referring to FIG. 7, the driving electrodes TE may include the first branch electrodes TEa and the second branch electrodes TEb. The first branch electrodes TEa may include (1-1)-th through (1-n)-th branch electrodes TEa1 through TEa(n) (where n is an integer of 2 or greater), and the second branch electrodes TEb may include (2-1)-th through (2-n)-th branch electrodes TEb1 through TEb(n).

The first branch electrodes TEa and the second branch electrodes TEb may branch off of the driving lines TL. Thus, a pair of first and second branch electrodes TEa and TEb that branch off of the same driving line TL may receive the same touch driving signal. The driving electrodes TE may be transparent electrodes.

The first branch electrodes TEa may extend in the second direction (or the Y-axis direction) in the first touch sensor area TSA1 and may be spaced apart from one another in the first direction (or the X-axis direction). Each of the first branch electrodes TEa may include a plurality of first branch cell electrodes TCEa and a plurality of first branch line electrodes TLEa.

The first branch cell electrodes TCEa may be spaced apart from one another in the second direction (or the Y-axis direction). The first branch cell electrodes TCEa may be spaced apart from, and surround, first sides of odd cell electrodes ODDC. The first branch cell electrodes TCEa may be symmetrical with sensing cell electrodes RCE with respect to the odd cell electrodes ODDC. The first branch line electrodes TLEa may extend in the second direction (or the Y-axis direction) to connect the first branch cell electrodes TCEa. The first branch cell electrodes TCEa and the first branch line electrodes TLEa may be arranged in the same layer, but embodiments according to the present disclosure are not limited thereto.

The odd electrodes ODD may extend in the second direction (or the Y-axis direction) in the first touch sensor area TSA1 and may be spaced apart from one another in the first direction (or the X-axis direction). The odd electrodes ODD may be transparent electrodes. Each of the odd electrodes ODD may include a plurality of odd cell electrodes ODDC and a plurality of odd line electrodes ODDL.

The odd cell electrodes ODDC may be spaced apart from one another in the second direction (or the Y-axis direction). The odd cell electrodes ODDC may be arranged in the same layer as the first branch cell electrodes TCEa. The first sides of the odd cell electrodes ODDC may be spaced apart from, and surrounded by, the first branch cell electrodes TCEa, and second sides of the odd cell electrodes ODDC may be spaced apart from, and surrounded by, the sensing cell electrodes RCE. The odd line electrodes ODDL may extend in the second direction (or the Y-axis direction) to connect the odd cell electrodes ODDC. The odd cell electrodes ODDC and the odd line electrodes ODDL may be arranged in the same layer, but embodiments according to the present disclosure are not limited thereto.

The sensing electrodes RE may extend in the first direction (or the X-axis direction) and may be spaced apart from one another in the second direction (or the Y-axis direction). The sensing electrodes RE may be transparent electrodes. Each of the sensing electrodes RE may include a plurality of sensing cell electrodes RCE and a plurality of sensing line electrodes RLE.

The sensing cell electrodes RCE may be spaced apart from one another in the first direction (or the X-axis direction) in the first touch sensor area TSA1. The sensing cell electrodes RCE may be arranged in the same layer as the first branch cell electrodes TCEa and the odd cell electrodes ODDC. The sensing cell electrodes RCE may be spaced apart from, and surround, the second sides of the odd cell electrodes ODDC. The sensing cell electrodes RCE may be symmetrical with the first branch cell electrodes TCEa with respect to the odd cell electrodes ODDC. The sensing line electrodes RLE may extend in the first direction (or the X-axis direction) to connect the sensing cell electrodes RCE. The sensing line electrodes RLE may be arranged in a different layer from the first branch line electrodes TLEa and the odd line electrodes ODDL. Thus, the sensing line electrodes RLE may intersect, but be insulated from, the first branch line electrodes TLEa and the odd line electrodes ODDL.

The second branch electrodes TEb may extend in the second direction (or the Y-axis direction) in the second touch sensor area TSA2 and may be spaced apart from one another in the first direction (or the X-axis direction). Each of the second branch electrodes TEb may include a plurality of second branch cell electrodes TCEb and a plurality of second branch line electrodes TLEb.

The second branch cell electrodes TCEb may be spaced apart from one another in the second direction (or the Y-axis direction). The second branch cell electrodes TCEb may be spaced apart from, and surround, first sides of even cell electrodes EVENC. The second branch cell electrodes TCEb may be symmetrical with the sensing cell electrodes RCE with respect to the even cell electrodes EVENC. The second branch line electrodes TLEb may extend in the second direction (or the Y-axis direction) to connect the second branch cell electrodes TCEb. The second branch cell electrodes TCEb and the second branch line electrodes TLEb may be arranged at the same layer, but embodiments according to the present disclosure are not limited thereto.

The even electrodes EVEN may extend in the second direction (or the Y-axis direction) in the second touch sensor area TSA2 and may be spaced apart from one another in the first direction (or the X-axis direction). The even electrodes EVEN may be transparent electrodes. Each of the even electrodes EVEN may include a plurality of even cell electrode EVENC and a plurality of even line electrode EVENL.

The even cell electrodes EVENC may be spaced apart from one another in the second direction (or the Y-axis direction). The even cell electrodes EVENC may be arranged at the same layer as the second branch cell electrodes TCEb. First sides of the even cell electrodes EVENC may be spaced apart from, and surrounded by, the second branch cell electrodes TCEb, and second sides of the even cell electrodes EVENC may be spaced apart from, and surrounded by, the sensing cell electrodes RCE. The even line electrode EVENL may extend in the second direction (or the Y-axis direction) to connect the even cell electrodes EVENC. The even cell electrodes EVENC and the even line electrodes EVENL may be arranged at the same layer, but embodiments according to the present disclosure are not limited thereto.

The sensing cell electrode RCE may be spaced apart from one another in the first direction (or the X-axis direction) in the second touch sensor area TSA2. The sensing cell electrodes RCE may be arranged at the same layer as the second branch cell electrodes TCEb and the even cell electrode EVENC. The sensing cell electrodes RCE may be spaced apart from, and surround, the second sides of the even cell electrode EVENC. The sensing cell electrode RCE may be symmetrical with the second branch cell electrodes TCEb with respect to the even cell electrode EVENC. The sensing line electrodes RLE may extend in the first direction (or the X-axis direction) to connect the sensing cell electrodes RCE. The sensing line electrodes RLE may be arranged at a different layer from the second branch line electrodes TLEb and the even line electrodes EVENL. Thus, the sensing line electrodes RLE may intersect, but be insulated from, the second branch line electrodes TLEb and the even line electrode EVENL.

The touch sensing unit TSU may include a plurality of touch cells CEL. The touch driver 400 may detect the presence of touch input and calculate the coordinates of touch input by detecting the touch of the touch cells CEL. The touch cells CEL may include a plurality of first touch cells CELa and a plurality of second touch cells CELb.

The first touch cells CELa may be arranged in the first touch sensor area TSA1. Each of the first touch cells CELa may include a first branch cell electrode TCEa, an odd cell electrode ODDC, and a sensing cell electrode RCE. Thus, each of the first touch cells CELa may further include a first capacitor between the first branch cell electrode TCEa and the sensing cell electrode RCE and a second capacitor between the odd cell electrode ODDC and the sensing cell electrode RCE.

The second touch cells CELb may be arranged in the second touch sensor area TSA2. Each of the second touch cells CELb may include a second branch cell electrode TCEb, an even cell electrode EVENC, and a sensing cell electrode RCE. Thus, each of the second touch cells CELb may further include a third capacitor between the second branch cell electrode TCEb and the sensing cell electrode RCE and a fourth capacitor between the even cell electrode EVENC and the sensing cell electrode RCE.

Figure 8:
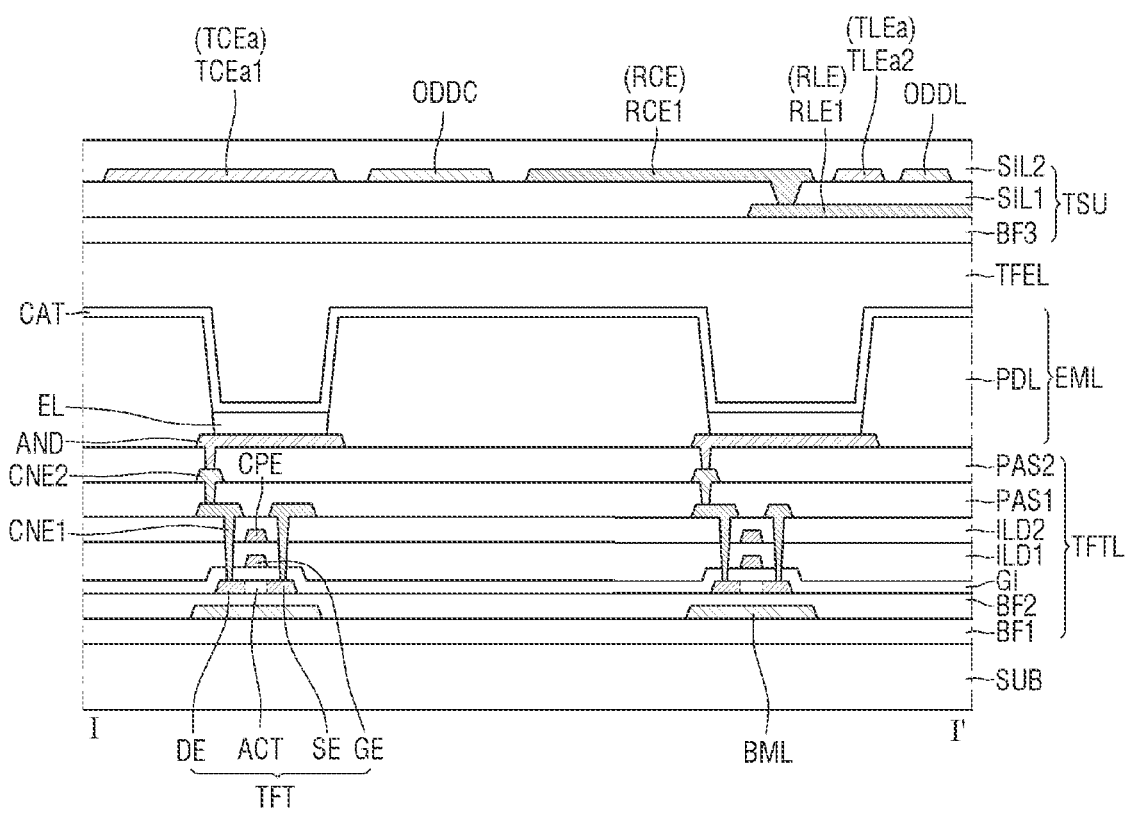
FIG. 8 is a cross-sectional view taken along the line I-I' of FIG. 7.

FIG. 8 is a cross-sectional view taken along the line I-I' of FIG. 7.

Referring to FIG. 8, the display panel 100 may include the display unit DU and the touch sensing unit TSU. The display unit DU may include the substrate SUB, the TFT layer TFTL, the light-emitting element layer EML, and the encapsulation layer TFEL.

The substrate SUB may be a base substrate or a base member and may be formed of an insulating material such as a polymer resin. The substrate SUB may be a flexible substrate that is bendable, foldable, or rollable. According to some embodiments, the substrate SUB may include a glass material or a metallic material, but embodiments according to the present disclosure are not limited thereto. According to some embodiments, the substrate SUB may include PI.

The TFT layer TFTL may include a first buffer layer BF1, a light-blocking layer BML, a second buffer layer BF2, TFTs "TFT", a gate insulating film GI, a first interlayer insulating film ILD1, capacitor electrodes CPE, a second interlayer insulating film ILD2, first connecting electrodes CNE1, a first passivation layer PAS1, second connecting electrodes CNE2, and a second passivation layer PAS2.

The first buffer layer BF1 may be arranged on the substrate SUB. The first buffer layer BF1 may include one or more inorganic films capable of preventing the penetration of the air or moisture. According to some embodiments, the first buffer layer BF1 may include a plurality of inorganic films that are alternately stacked.

A light-blocking layer BML may be arranged on the first buffer layer BF1. According to some embodiments, the light-blocking layer BML may be formed as a single layer or a multilayer including molybdenum (Mo), aluminum (Al), chromium (Cr), gold (Au), titanium (Ti), nickel (Ni), neodymium (Nd), copper (Cu), or an alloy thereof. According to some embodiments, the light-blocking layer BML may be an organic film including a black pigment.

The second buffer layer BF2 may cover the first buffer layer BF1 and the light-blocking layer BML. The second buffer layer BF2 may include one or more inorganic films capable of preventing the penetration of the air or moisture. According to some embodiments, the second buffer layer BF2 may include a plurality of inorganic films that are alternately stacked.

The TFTs "TFT" may be arranged on the second buffer layer BF2 and may configure the pixel circuit of each of a plurality of pixels. According to some embodiments, the TFTs "TFT" may be the driving or switching transistors of a pixel circuit. The TFTs "TFT" may include semiconductor regions ACT, source electrodes SE, drain electrodes DE, and gate electrodes GE.

The semiconductor regions ACT, the source electrodes SE, and the drain electrodes DE may be arranged on the second buffer layer BF2. The semiconductor regions ACT, the source electrodes SE, and the drain electrodes DE may overlap with the light-blocking layer BML in a thickness direction. The semiconductor regions ACT may overlap with the gate electrodes GE in the thickness direction and may be insulated from the gate electrodes GE by the gate insulating film GI. The source electrodes SE and the drain electrodes DE may be provided by turning the material of the semiconductor regions ACT into conductors.

The gate electrodes GE may be arranged on the gate insulating film GI. The gate electrodes GE may overlap with the semiconductor regions ACT with the gate insulating film GI interposed therebetween.

The gate insulating film GI may be provided on the semiconductor regions ACT, the source electrodes SE, and the drain electrodes DE. According to some embodiments, the gate insulating film GI may cover the semiconductor regions ACT, the source electrodes SE, the drain electrodes DE, and the second buffer layer BF2 and may insulate the semiconductor regions ACT from the gate electrodes GE. The gate insulating film GI may include contact holes that are penetrated by the first connecting electrodes CNE1.

The first interlayer insulating film ILD1 may cover the gate electrodes GE and the gate insulating film GI. The first interlayer insulating film ILD1 may include contact holes that are penetrated by the first connecting electrodes CNE1. The contact holes of the first interlayer insulating film ILD1 may be connected to the contact holes of the gate insulating film GI and the contact holes of the second interlayer insulating film ILD2.

The capacitor electrodes CPE may be arranged on the first interlayer insulating film ILD1. The capacitor electrodes CPE may overlap with the gate electrodes GE in the thickness direction.

The second interlayer insulating film ILD2 may cover the capacitor electrodes CPE and the first interlayer insulating film ILD1. The second interlayer insulating film ILD2 may include contact holes that are penetrated by the first connecting electrodes CNE1. The contact holes of the second interlayer insulating film ILD2 may be connected to the contact holes of the first interlayer insulating film ILD1 and the contact holes of the gate insulating film GI.

The first connecting electrodes CNE1 may be arranged on the second interlayer insulating film ILD2. The first connecting electrodes CNE1 may connect the drain electrodes DE of the TFTs "TFT" and the second connecting electrodes CNE2. The first connecting electrodes CNE1 may be inserted in the contact holes of the second interlayer insulating film ILD2, the contact holes of the first interlayer insulating film ILD1, and the contact holes of the gate insulating film GI and may thus be in contact with the drain electrodes DE of the TFTs "TFT".

The first passivation layer PAS1 may cover the first connecting electrodes CNE1 and the second interlayer insulating film ILD2. The first passivation layer PAS1 may protect the TFTs "TFT". The first passivation layer PAS1 may include contact holes that are penetrated by the second connecting electrodes CNE2.

The second connecting electrodes CNE2 may be arranged on the first passivation layer PAS1. The second connecting electrodes CNE2 may connect the first connecting electrodes CNE1 and pixel electrodes AND of light-emitting elements. The second connecting electrodes CNE2 may be inserted in the contact holes of the first passivation layer PAS1 and may thus be in contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes AND of the light-emitting elements.

The light-emitting elements EML may be arranged on the TFT layer TFTL. The light-emitting element layer EML may include the light-emitting elements and a pixel-defining film PDL. Each of the light-emitting elements may include a pixel electrode AND, an emission layer EL, and a common electrode CAT.

The pixel electrodes AND may be arranged on the second passivation layer PAS2. Each of the pixel electrodes AND may be arranged to overlap with one of a plurality of emission areas, which are defined by the pixel-defining film PDL. The pixel electrodes AND may be connected to the drain electrodes DE of the TFTs "TFT" through the first connecting electrodes CNE1 and the second connecting electrodes CNE2.

Emission layers EL may be arranged on the pixel electrodes AND. According to some embodiments, the emission layers EL may be organic emission layers including an organic material, but embodiments according to the present disclosure are not limited thereto. According to some embodiments, as the TFTs "TFT" apply a voltage (e.g., a set or predetermined voltage) to the pixel electrodes AND the common electrode CAT receives a common voltage or a cathode voltage, holes and electrons may move to the emission layers EL through hole transport layers and electron transport layers and may be combined together in the emission layers EL to emit light.

The common electrode CAT may be arranged on the emission layer EL. The common electrode CAT may be implemented as a common electrode for all pixels. According to some embodiments, the common electrode CAT may be arranged on the emission layers EL in the plurality of emission areas and on the pixel-defining film PDL in areas other than the plurality of emission areas.

The common electrode CAT may receive a common voltage or a low-potential voltage. As the pixel electrodes AND receive a data voltage and the common electrode CAT receives a low-potential voltage, an electric potential difference is formed between the pixel electrodes AND the common electrode CAT, and as a result, the emission layer EL can emit light.

The pixel-defining film PDL may define the plurality of emission areas. The pixel-defining film PDL may separate and insulate the pixel electrodes AND from one another.

The encapsulation layer TFEL may be arranged on the common electrode CAT and may cover the light-emitting elements. The encapsulation layer TFEL may include at least one inorganic film and may prevent the penetration of oxygen or moisture into the light-emitting element layer EML. The encapsulation layer TFEL may include at least one organic film and may protect the light-emitting element layer EML from a foreign material such as dust.

The touch sensing unit TSU may be arranged on the encapsulation layer TFEL. The touch sensing unit TSU may include a third buffer layer BF3, a sensing line electrode RLE, a first insulating film SIL1, a first branch cell electrode TCEa, an odd cell electrode ODDC, a sensing cell electrode RCE, a first branch line electrode TLEa, an odd line electrode ODDL, and a second insulating film SIL2.

The third buffer layer BF3 may be arranged on the encapsulation layer TFEL. The third buffer layer BF3 may have an insulating function and an optical function. The third buffer layer BF3 may include at least one inorganic film. Optionally, the third buffer layer BF3 may not be provided.

The sensing line electrode RLE may be arranged on the third buffer layer BF3. The sensing line electrode RLE may connect a pair of adjacent sensing cell electrodes RCE in the first direction (or the X-axis direction). The sensing line electrode RLE may be arranged in a different layer from the first branch line electrode TLEa and the odd line electrode ODDL. Thus, the sensing line electrode RLE may intersect, but be insulated from, the first branch line electrode TLEa and the odd line electrode ODDL.

A first insulating film SIL1 may cover the sensing line electrode RLE and the third buffer layer BF3. The first insulating film SIL1 may have an insulating function and an optical function. According to some embodiments, the first insulating film SIL1 may be an inorganic film including at least one of a silicon nitride layer, a silicon oxynitride layer, a silicon oxide layer, a titanium oxide layer, or an aluminum oxide layer.

The first branch cell electrode TCEa, the odd cell electrode ODDC, the sensing cell electrode RCE, the first branch line electrode TLEa, and the odd line electrode ODDL may be arranged on the first insulating film SIL1. The first branch cell electrode TCEa, the odd cell electrode ODDC, the sensing cell electrode RCE, the first branch line electrode TLEa, and the odd line electrode ODDL may be transparent electrodes.

The second insulating film SIL2 may cover the first branch cell electrodes TCEa, the odd cell electrodes ODDC, the sensing cell electrodes RCE, the first branch line electrodes TLEa, and the odd line electrodes ODDL. The second insulating film SIL2 may have an insulating function and an optical function. According to some embodiments, the second insulating film SIL2 may be formed of one of the above-described example materials that can be used to form the first insulating film SIL1.

Figure 9:
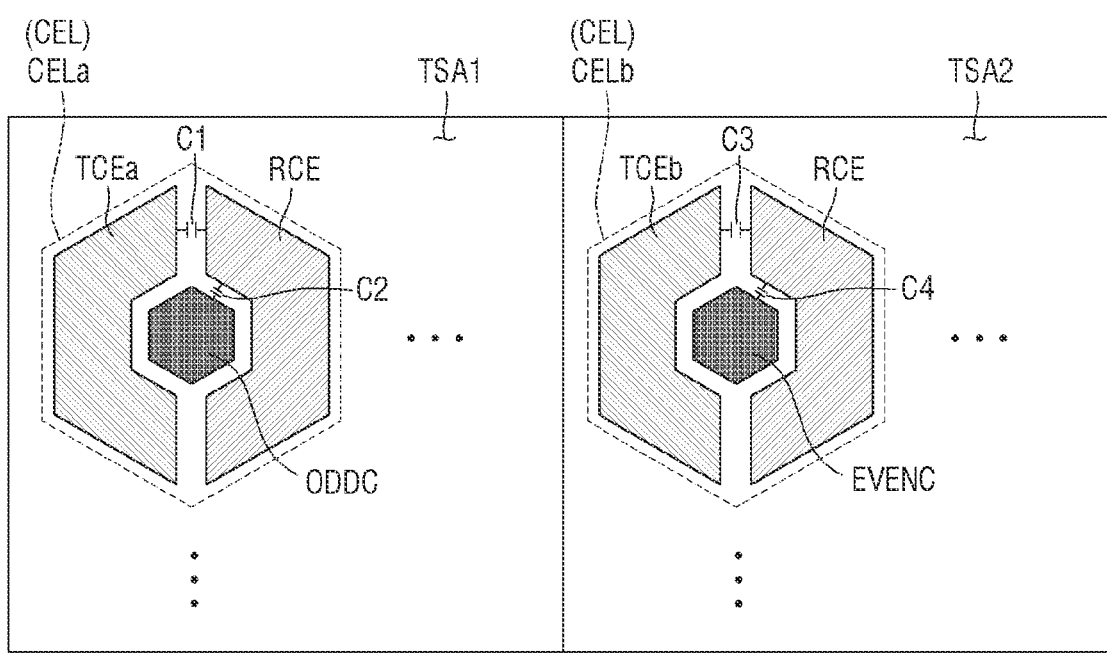
FIG. 9 is a plan view illustrating first and second touch cells of the display device of FIG. 1.
Figure 10:
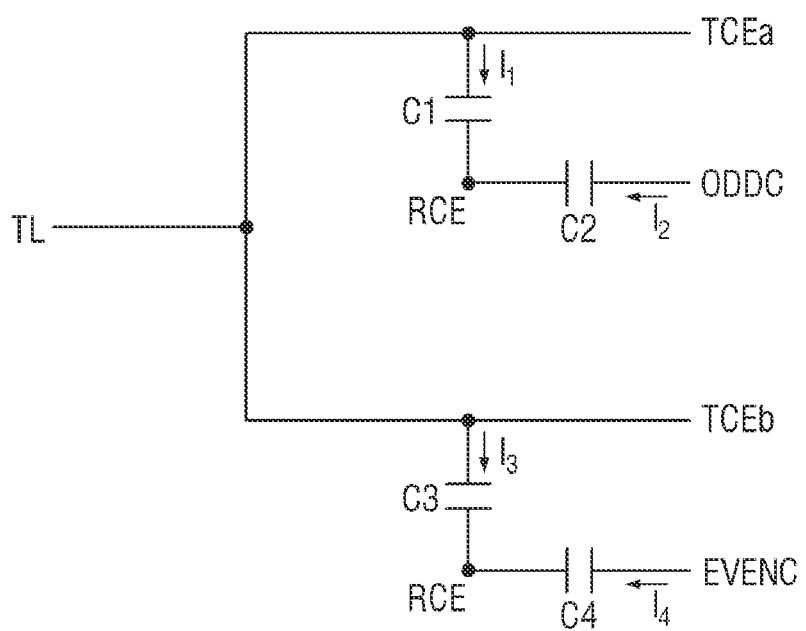
FIG. 10 is a circuit diagram illustrating first through fourth capacitors of the first and second touch cells of FIG. 9.

FIG. 9 is a plan view illustrating first and second touch cells of the display device of FIG. 1, and FIG. 10 is a circuit diagram illustrating first through fourth capacitors of the first and second touch cells of FIG. 9.

Referring to FIGS. 9 and 10, the touch sensing unit TSU may include a plurality of touch cells CEL. The touch driver 400 may detect the presence of touch input and calculate the coordinates of touch input by detecting the touch of the touch cells CEL. The touch cells CEL may include a plurality of first touch cells CELa and a plurality of second touch cells CELb.

The first touch cells CELa may be arranged in the first touch sensor area TSA1. Each of the first touch cells CELa may include a first branch cell electrode TCEa, an odd cell electrode ODDC, and a sensing cell electrode RCE. Thus, each of the first touch cells CELa may further include a first capacitor C1 between the first branch cell electrode TCEa and the sensing cell electrode RCE and a second capacitor C2 between the odd cell electrode ODDC and the sensing cell electrode RCE.

The second touch cells CELb may be arranged in the second touch sensor area TSA2. Each of the second touch cells CELb may include a second branch cell electrode TCEb, an even cell electrode EVENC, and a sensing cell electrode RCE. Thus, each of the second touch cells CELb may further include a third capacitor C3 between the second branch cell electrode TCEb and the sensing cell electrode RCE and a fourth capacitor C4 between the even cell electrode EVENC and the sensing cell electrode RCE.

Referring to FIGS. 9 and 10 and further to FIG. 5, the touch driver 400 may sense variations in the capacitances of first capacitors C1 and second capacitors C2 by providing the (1-1)-th through (1-n)-th touch driving signals TSa1 through TSa(n) to the first branch electrodes TEa over the first through n-th periods t1 through t(n) and providing the odd signal ODDS to the odd electrodes ODD over the odd period todd.

The touch driver 400 may sense variations in the capacitances of third capacitors C3 and fourth capacitors C4 by providing the (2-1)-th through (2-n)-th touch driving signals TSb1 through TSb(n) to the second branch electrodes TEb over the (n+1)-th through 2n-th periods t(n+1) through t(2n) and providing the even signal EVENS to the even electrodes EVEN over the even period teven.

According to some embodiments, the static charges of the first touch cells CELa and the second touch cells CELb during the odd period todd and the static charges of the first touch cells CELa and the second touch cells CELb during the even period teven may be as shown in Equations (1) and (2):

$$Q1+Q2+Q3 = C1 \times V1 + C2 \times V2 + C3 \times V3 \quad (1); \text{ and}$$

$$Q1+Q3+Q4 = C1 \times V1 + C3 \times V3 + C4 \times V4 \quad (2)$$

where "Q" denotes the static charge of each capacitor, "C" denotes the capacitance of each capacitor, and "V" denotes the voltage between both ends of each capacitor.

Thus, a displacement current I of the first touch cells CELa and the second touch cells CELb may be as shown in Equation (3):

$$I = \frac{dQ1}{dt} + \frac{dQ2}{dt} + \frac{dQ3}{dt} + \frac{dQ4}{dt} = \frac{d}{dt}(C1 \times V1 + C2 \times V2 + C3 \times V3 + C4 \times V4)$$

When the first touch cells CELa are touched, the displacement current I of the first touch cells CELa may be as shown in Equation (4):

$$I = \frac{dQ1}{dt} + \frac{dQ2}{dt} = \frac{d}{dt}(C1 \times V1 + C2 \times V2)$$

When the second touch cells CELb are touched, the displacement current I of the second touch cells CELb may be as shown in Equation (5):

$$I = \frac{dQ3}{dt} + \frac{dQ4}{dt} = \frac{d}{dt}(C3 \times V3 + C4 \times V4)$$

When the first touch cells CELa and the second touch cells CELb are both touched at the same time, the displacement current I of the first touch cells CELa and the second touch cells CELb during the odd period todd may be as shown in Equation (6):

$$I = \frac{dQ1}{dt} + \frac{dQ2}{dt} + \frac{dQ3}{dt} = \frac{d}{dt}(C1 \times V1 + C2 \times V2 + C3 \times V3)$$

When the first touch cells CELa and the second touch cells CELb are both touched at the same time, the displacement current I of the first touch cells CELa and the second touch cells CELb during the even period teven may be as shown in Equation (7):

$$I = \frac{dQ1}{dt} + \frac{dQ3}{dt} + \frac{dQ4}{dt} = \frac{d}{dt}(C1 \times V1 + C3 \times V3 + C4 \times V4)$$

Thus, the touch driver 400 can sense variations in the capacitances between the driving electrodes TE, which are arranged in 2n columns, and the sensing electrodes RE using n driving lines TL and two split lines SL. Accordingly, the touch driver 400 can reduce the number of driving lines TL and the sizes of the first touch pads TP1 and the circuit board 300 by driving the touch sensing unit TSU in a time-division manner using combinations of the odd signal ODDS, the even signal EVENS, the first touch driving signals TSa, and the second touch driving signals TSb.

Although aspects of some embodiments of the present invention have been described, it is understood that embodiments according to the present invention should not be limited to these embodiments but various changes and modifications can be made by one ordinary skilled in the art within the spirit and scope of the present invention as defined in the appended claims, and their equivalents.

What is claimed is:

1. A display device comprising:
a display unit including a plurality of pixels; and
a touch sensing unit on a surface of the display unit, the touch sensing unit including first and second touch sensor areas adjacent to each other along a first direction,
wherein the touch sensing unit further comprises:
a plurality of driving electrodes branched off from a plurality of driving lines, with the plurality of driving electrodes extending in a second direction intersecting the first direction, in each of the first and second touch sensor areas;
a plurality of sensing electrodes extending in the first direction;
a plurality of odd electrodes extending in the second direction in the first touch sensor area; and
a plurality of even electrodes extending in the second direction in the second touch sensor area,
wherein the driving electrodes comprises:
a plurality of first branch electrodes branched off of the plurality of driving lines and the plurality of first branch electrodes are in the first touch sensor area; and
a plurality of second branch electrodes branched off of the driving lines and the plurality of second branch electrodes are in the second touch sensor area,
wherein
the odd electrodes are between the first branch electrodes and the sensing electrodes in the first touch sensor area, and
the even electrodes are between the second branch electrodes and the sensing electrodes in the second touch sensor area.

2. The display device of claim 1, wherein each pair of first and second branch electrodes branched off of the same driving line are configured to receive a same touch driving signal.

3. The display device of claim 1, wherein each of the first branch electrodes comprises:
a plurality of first branch cell electrodes spaced apart from one another in the second direction; and
a plurality of first branch line electrodes connecting the first branch cell electrodes, and
each of the second branch electrodes comprises:
a plurality of second branch cell electrodes spaced apart from one another in the second direction; and
a plurality of second branch line electrodes connecting the second branch cell electrodes.

4. The display device of claim 3, wherein each of the sensing electrodes comprises:
a plurality of sensing cell electrodes spaced apart from one another in the first direction; and
a plurality of sensing line electrodes connecting the sensing cell electrodes.

5. The display device of claim 4, wherein
the first branch cell electrodes and the sensing cell electrodes are symmetrical with respect to the odd electrodes, and
the second branch cell electrodes and the sensing cell electrodes are symmetrical with respect to the even electrodes.

6. The display device of claim 4, wherein
each of the odd electrodes comprises:
a plurality of odd cell electrodes spaced apart from one another in the second direction; and
a plurality of odd line electrodes connecting the odd cell electrodes, and
each of the even electrodes comprises:
a plurality of even cell electrodes spaced apart from one another in the second direction; and
a plurality of even line electrodes connecting the even cell electrodes.

7. The display device of claim 6, wherein the touch sensing unit further comprises:
first touch cells including the first branch cell electrodes, some of the sensing cell electrodes, and the odd cell electrodes; and
second touch cells including the second branch cell electrodes, others of the sensing cell electrodes, and the even cell electrodes.

8. The display device of claim 6, wherein
the first branch cell electrodes surround first sides of the odd cell electrodes to be spaced apart from each other,
the sensing cell electrodes surround second sides of the odd cell electrodes to be spaced apart from each other,
the second branch cell electrodes surround first sides of the even cell electrodes to be spaced apart from each other, and
the sensing cell electrodes surround second sides of the even cell electrodes to be spaced apart from each other.

9. The display device of claim 6, wherein the driving electrodes, the odd electrodes, the even electrodes, and the sensing cell electrodes are at a same layer.

10. The display device of claim 6, wherein the sensing line electrodes are at a different layer from the driving electrodes, the odd electrodes, the even electrodes, and the sensing cell electrodes.

11. The display device of claim 1, wherein
the odd electrodes are configured to receive an odd signal during an odd period of a touch frame period, the even electrodes are configured to receive an even signal during an even period of the touch frame period, and the driving lines are configured to provide a plurality of touch driving signals to the driving electrodes, the touch driving signals are sequentially delayed over the odd and even periods.

12. The display device of claim 11, further comprising a touch driver configured to provide the odd signal, the even signal, and the touch driving signals to the touch sensing unit.

13. The display device of claim 12, wherein
during the odd period, the touch driver is configured to detect the touch of the first touch sensor area based on variations in capacitances between the first branch electrodes and the sensing electrodes and variations in capacitances between the odd electrodes and the sensing electrodes, and during the even period, the touch driver is configured to detect the touch of the second touch sensor area based on variations in capacitances between the second branch electrodes and the sensing electrodes and variations in capacitances between the even electrodes and the sensing electrodes.

14. The display device of claim 12, wherein during the odd period, the touch driver is configured to detect the touch of the first and second touch sensor areas based on variations in capacitances between the first branch electrodes and the sensing electrodes, variations in capacitances between the odd electrodes and the sensing electrodes, and variations in capacitances between the second branch electrodes and the sensing electrodes.

15. The display device of claim 12, wherein during the even period, the touch driver is configured to detect the touch of the first and second touch sensor areas based on variations in capacitances between the first branch electrodes and the sensing electrodes, variations in capacitances between the second branch electrodes and the sensing electrodes, and variations in capacitances between the even electrodes and the sensing electrodes.

16. The display device of claim 12, wherein the touch driver is configured to provide touch driving signals having different pulse widths to the driving lines.

17. The display device of claim 1, further comprising:
first touch pads connected to the driving lines;
second touch pads connected to a first split line connected to the odd electrodes, and a second split line connected to the even electrodes; and
third touch pads connected to a plurality of sensing lines, the sensing lines are connected to the sensing electrodes.

18. The display device of claim 17, wherein the first and second split lines are at a different layer from the driving lines.

* * * * *